United States Patent
Romero (10) Patent No.: US 10,495,701 B2
(45) Date of Patent: Dec. 3, 2019

(54) CIRCULAR VERTICAL HALL (CVH) SENSING ELEMENT WITH DC OFFSET REMOVAL

(71) Applicant: Allegro MicroSystems, LLC, Manchester, NH (US)

(72) Inventor: Hernán D. Romero, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 52 days.

(21) Appl. No.: 15/447,507

(22) Filed: Mar. 2, 2017

(65) Prior Publication Data

US 2018/0252779 A1 Sep. 6, 2018

(51) Int. Cl.
*G01R 33/07* (2006.01)
*G01R 33/00* (2006.01)

(52) U.S. Cl.
CPC ....... *G01R 33/077* (2013.01); *G01R 33/0029* (2013.01); *G01R 33/072* (2013.01)

(58) Field of Classification Search
CPC . G01R 33/077; G01R 33/0029; G01R 33/072
See application file for complete search history.

(56) References Cited

U.S. PATENT DOCUMENTS

| | | |
|---|---|---|
| 4,668,914 A | 5/1987 | Kersten et al. |
| 4,761,569 A | 8/1988 | Higgs |
| 4,829,352 A | 5/1989 | Popovic et al. |
| 5,541,506 A | 7/1996 | Kawakita et al. |
| 5,572,058 A | 11/1996 | Biard |
| 5,612,618 A | 3/1997 | Arakawa |

(Continued)

FOREIGN PATENT DOCUMENTS

| | | |
|---|---|---|
| DE | 10 2005 014 509 B4 | 10/2006 |
| DE | 10 2006 037 226 A1 | 2/2008 |

(Continued)

OTHER PUBLICATIONS

Allegro Microsystems, Inc.; "High Precision Linear Hall Effect Sensor IC with a Push/Pull, Pulse Width Modulated Output;" A1351; pp. 1-23; 23 pages.

(Continued)

*Primary Examiner* — Akm Zakaria
(74) *Attorney, Agent, or Firm* — Daly, Crowley, Mofford & Durkee, LLP (57) ABSTRACT

A magnetic field sensor includes a semiconductor substrate, a circular vertical Hall (CVH) sensing element comprising a plurality of Hall elements arranged over an implant region in a semiconductor substrate, adjacent ones of the plurality of vertical Hall element at predetermined angles from each other. A CVH output stage may comprise one or more of drive circuits to drive the plurality of vertical Hall elements and produce an analog signal, and a filter coupled to the CVH output stage to receive the analog signal. The filter may be configured to remove a DC component from the analog signal to produce a filtered signal. An analog-to-digital converter may be coupled to receive the filtered signal and produce a digital signal. A processor stage may be coupled to receive the filtered signal and operable to compute an estimated angle of the external magnetic field.

15 Claims, 7 Drawing Sheets

(56) References Cited

U.S. PATENT DOCUMENTS

| | | |
|---|---|---|
| 5,619,137 A | 4/1997 | Vig et al. |
| 5,621,319 A | 4/1997 | Bilotti et al. |
| 5,657,189 A | 8/1997 | Sandhu |
| 5,694,038 A | 12/1997 | Moody et al. |
| 5,831,513 A | 11/1998 | Lue |
| 5,844,411 A | 12/1998 | Vogt |
| 5,942,895 A | 8/1999 | Popovic et al. |
| 6,064,199 A | 5/2000 | Waiter et al. |
| 6,064,202 A | 5/2000 | Steiner et al. |
| 6,091,239 A | 7/2000 | Vig et al. |
| 6,100,680 A | 8/2000 | Vig et al. |
| 6,111,463 A * | 8/2000 | Kimura .............. H03F 1/3211 327/359 |
| 6,166,535 A | 12/2000 | Irle et al. |
| 6,232,768 B1 | 5/2001 | Moody et al. |
| 6,236,199 B1 | 5/2001 | Irle et al. |
| 6,265,864 B1 | 7/2001 | De Winter et al. |
| 6,288,533 B1 | 9/2001 | Haeberli et al. |
| 6,297,627 B1 | 10/2001 | Towne et al. |
| 6,356,741 B1 | 3/2002 | Bilotti et al. |
| 6,525,531 B2 | 2/2003 | Forrest et al. |
| 6,542,068 B1 | 4/2003 | Drapp et al. |
| 6,545,462 B2 | 4/2003 | Schott et al. |
| 6,622,012 B2 | 9/2003 | Bilotti et al. |
| 6,768,301 B1 | 7/2004 | Hohe et al. |
| 6,969,988 B2 | 11/2005 | Kakuta et al. |
| 7,030,606 B2 | 4/2006 | Kato et al. |
| 7,038,448 B2 | 5/2006 | Schott et al. |
| 7,085,119 B2 | 8/2006 | Bilotti et al. |
| 7,119,538 B2 | 10/2006 | Blossfeld |
| 7,159,556 B2 | 1/2007 | Yoshihara |
| 7,235,968 B2 | 6/2007 | Popovic et al. |
| 7,259,556 B2 | 8/2007 | Popovic et al. |
| 7,307,824 B2 | 12/2007 | Bilotti et al. |
| 7,362,094 B2 | 4/2008 | Voisine et al. |
| 7,714,570 B2 | 5/2010 | Thomas et al. |
| 7,746,065 B2 | 6/2010 | Pastre et al. |
| 7,759,929 B2 | 7/2010 | Forsyth |
| 7,872,322 B2 | 1/2011 | Schott et al. |
| 7,911,203 B2 | 3/2011 | Thomas et al. |
| 7,965,076 B2 | 6/2011 | Schott |
| 7,994,774 B2 | 8/2011 | Thomas et al. |
| 2006/0011999 A1 | 1/2006 | Schott et al. |
| 2009/0121707 A1 | 5/2009 | Schott |
| 2009/0174395 A1 | 7/2009 | Thomas et al. |
| 2010/0164491 A1* | 7/2010 | Kejik .................. G01R 33/07 324/251 |
| 2010/0166397 A1 | 7/2010 | De Luca |
| 2010/0237884 A1* | 9/2010 | Bult .................. H01F 17/0006 324/705 |
| 2011/0248708 A1 | 10/2011 | Thomas et al. |
| 2012/0133418 A1* | 5/2012 | Chen .................. H03D 7/1425 327/359 |
| 2017/0363693 A1* | 12/2017 | Polley .................. G01R 33/0029 |

FOREIGN PATENT DOCUMENTS

| | | |
|---|---|---|
| EP | 0 631 416 B1 | 12/1994 |
| EP | 0 875 733 B1 | 11/1998 |
| EP | 0 916 074 B1 | 5/1999 |
| EP | 2 000 814 A2 | 12/2008 |
| JP | 58-055688 A | 4/1983 |
| JP | 2003-042709 | 2/2003 |
| JP | 2005-241269 | 9/2005 |
| JP | 2010-014607 | 1/2010 |
| JP | 2010-078366 | 4/2010 |
| WO | WO 1998/010302 | 3/1998 |
| WO | WO 1998/054547 | 12/1998 |
| WO | WO 2000/002266 | 1/2000 |
| WO | WO 2003/036732 A2 | 5/2003 |
| WO | WO 2004/025742 A1 | 3/2004 |
| WO | WO 2006/056829 A1 | 6/2006 |
| WO | WO 2006/074989 A2 | 7/2006 |
| WO | WO 2008 145662 A1 | 12/2008 |
| WO | WO 2009/124969 A1 | 10/2009 |

OTHER PUBLICATIONS

Allegro Microsystems, Inc.; "High Precision 2-Wire Linear Hall Effect Sensor IC with a Pulse Width Modulated Output;" A1354; pp. 1-22; 22 pages.

Allegro Microsystems, Inc.; "High Precision Linear Hall-Effect Sensor with an Open Drain Pulse Width Modulated Output;" A1356; pp. 1-20; 20 pages.

Allegro Microsystems, Inc.; "Low-Noise Programmable Linear Hall Effect Sensor ICs with Adjustable Bandwidth (50 kHz Maximum) and Analog Output;" A1360, A1361 and A1362; pp. 1-25; 25 pages.

Baschirotto et al.; "Development and Analysis of a PCB Vector 2-D Magnetic Field Sensor System for Electronic Compasses;" IEEE Sensors Journal, vol. 6, No. 2; Apr. 2006; pp. 365-371; 7 pages.

Kejik, et al.; "Purley CMOS Angular Position Sensor Based on a New Hall Microchip;" 34th Annual Conference of IEEE Industrial Electronics; IECON; Nov. 10-13, 2008; pp. 1777-1781; 5 pages.

Kejik,.et al.; "Ultra Low-Power Angular Position Sensor for High-Speed Portable Applications;" 2009 IEEE Sensors Conference; Oct. 25-28, 2009; pp. 173-176; 4 pages.

Reymond, et al.; "True 20 CMOS Integrated Hall Sensor;" 2007 IEEE Sensors Conference; Oct. 28-31, 2007; pp. 860-863; 4 pages.

Gerhauser; "Intelligente 3D-Magnetfeld Snesorik;" Fraunhofer-Institut for Integrierte Schaltungen IIS; www.iis.fraunhofer.de/asic/analog; Oct. 2009; 2 pages.

Meiexis Microelectronic Integrated Systems; MLX90333; "Triaxis 3D-Joystick Position Sensor;" Data Sheet; Mar. 2009; 43 pages.

MEMSIC Corporation; AN-00MM-004; "Electronic Tilt Compensation;" Mar. 2008; 5 pages.

MEMSIC Corporation; An-00MM-003; "Magnetic Sensor Calibration;" Mar. 2008; 5 pages.

MEMSIC Corporation; AN-00MM-002; "Magnetometer Soldering Methodology;" Jun. 2008; 2 pages.

MEMSIC Corporation; AN-00MM-001; "Magnetometer Fundamentals;" Jun. 2008; 6 pages.

MEMSIC Corporation; AN-00MM-005; "Magnetic Sensor Placement Guidelines," Oct. 2008; 2 pages.

MEMSIC Corporation; MMC312xMQ; "Tri-axis Magnetic Sensor, with I$^2$C Interface;" Aug. 14, 2009; 9 pages.

MEMSIC Corporation; MMC314xMS; "Ultra Small 3-axis Magnetic Sensor, with I$^2$C Interface;" Mar. 31, 2010; 8 pages.

Micronas GmbH; "HAL® 3625 Programmable Direct Angle Sensor;" Product Information; Sep. 2009; 2 pages.

U.S. Appl. No. 15/012,125, filed Feb. 1, 2016, Alpago, et al.
U.S. Appl. No. 15/012,131, filed Feb. 1, 2016, Alpago, et al.
U.S. Appl. No. 15/012,142, filed Feb. 1, 2016, Alpago, et al.
U.S. Appl. No. 15/180,199, filed Jun. 13, 2016, Romero.

Banjevic; "High Bandwidth CMOS Magnetic Sensors Based on the Miniaturized Circular Vertical Hall Device;" Sep. 2011; 153 pages.

Drljaca, et al.; "Nonlinear Effects in Magnetic Angular Position Sensor With Integrated Flux Concentrator;" Proc. 23rd International Conference on Microelectronics (MIEL 2002); vol. 1; NIS; Yugoslavia; May 12-15, 2002; pp. 223-226; 4 pages.

Melexis MLX 90324; ""Under-the-Hood" Triaxis Rotary Position feat. SENT Protocol;" 3901090324 Data Sheet; Dec. 2008; 40 pages.

Petrie; "Circular Vertical Hall Magnetic Field Sensing Element and Method with a Plurality of Continuous Output Signals;" U.S. Appl. No. 13/035,243; filed Feb. 25, 2011; 56 pages.

Meher et al.: "50 Years of CORDIC: Algorithms, Architectures, and Applications", IEEE Transactions on Circuits and Systems; vol. 56, No. 9. Sep. 2009; p. 1893-1907 (15 pages).

Andraka, Ray: "A survey of CORDIC algorithms for FPGA based computers"; FPGA-1998, Montgomery, CA; (10 pages).

Granig et al.: "Integrated Giant Magnetic Resistance based Angle Sensor", IEEE SENSORS 2006, EXCO, Daegu, Korea; Oct. 22-25, 2006; pp. 542-545 (4 pages).

(56) References Cited

OTHER PUBLICATIONS

Ausserlechner, Udo: "The Optimum Layout for Giant Magneto-Resistive Angle Sensors", IEEE Sensors Journal, vol. 10, No. 10, Oct. 2010; pp. 1571-1582 (12 pages).
Allegro Microsystems, Inc.; "A1140/41/42/43 Data Sheet: Sensitive Two-Wire Chopper-Stabilized Unipolar Hall-Effect Switches:" published Sep. 9, 2004; pp. 1-11; 11 pages.
Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13; 13 pages.
Allegro Microsystems, Inc.; "A1230 Data Sheet: Ultra-Sensitive Dual-Channel Quadrature Hall-Effect Bipolar Switch;" published Mar. 26, 2010; 16 sheets.
Allegro Microsystems, Inc.; "A1351 Data Sheet: High Precision Linear Hall Effect Sensor with a Push/Pull, Pulse width Modulated Output;" published Mar. 7, 2008; pp. 1-23; 23 pages.
Allegro Microsystems, Inc.; "A1360, A1361 and A1362 Data Sheet: Low-Noise Programmable Linear Hall Effect Sensors with Adjustable Bandwidth (50 kHz Maximum) and Analog Output;" published Mar. 18, 2008; pp. 1-25; 25 pages.
Allegro Microsystems, Inc.; "A3212 Data Sheet: Micropower, Ultra-Sensitive Hall-Effect Switch;" published Sep. 22, 2004; pp. 1-12; 12 pages.
Allegro Microsystems, Inc.; "ATS675LSE Data Sheet: Self-Calibrating TPOS Speed Sensor Optimized for Automotive Cam Sensing Applications;" published Jul. 11, 2008; pp. 1-13; 13 pages.
Allegro Microsystems, Inc.; "27701-AN Data Sheet: Hall-Effect IC Applications Guide;" Application Information, Rev. 2; htttb://www.allegromicro.com/en/products/design/hall-effect-sensor-ic-applications-guide/AN27701.pdf; downloaded Sep. 29, 2010; pp. 1-40; 40 pages.
Allegro Microsystems, Inc.; "3235 Data Sheet 27633A, Dual-Output Hall-Effect Switch;" http://www.datasheetcatalog.org/datasheets/90/205047_DS.pdf; downloaded Sep. 29, 2010; 6 sheets.
Allegro Microsystems, Inc.; "A3425 Data Sheet: Dual, Chopper-Stabilized, Ultra-Sensitive Bipolar Hall-Effect Switch;" published Jun. 28, 2002; pp. 1-10; 10 pages.
Atherton et al; "Sensor Signal Conditioning—an IC Designer's Perspective;" IEEE Electro International; Apr. 26-28, 1991; pp. 129-134; 6 pages.
Austria Microsystems; "AS5040 datasheet; 10-Bit Programmable Magnetic Rotary Encoder;" Revision 1.1; Jan. 2004; pp. 1-20; 20 pages.
Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880 ; 4 pages.
Blanchard et al; "Cylindrical Hall Device;" International Electron Devices Meeting; Dec. 8-11, 1996; pp. 541-544; 4 pages.
Burger et al.; "New fully integrated 3-D silicon Hall sensor for precise angular-position measurements;" Sensors and Actuators, A 67; May 1998; pp. 72-76; 5 pages.
Dwyer; "Allegro Microsystems, Inc.; AN296061 Data Sheet: Ring Magnet Speed Sensing for Electronic Power Steering;" published Jul. 21, 2009; pp. 1-4.
Freitas et al.; "Giant magnetoresistive sensors for rotational speed control;" Jorunal of Applied Physics, vol. 85, No. 8; Apr. 15. 1999; pp. 5459-5461; 3 pages.
Gilbert; "Technical Advances in Hail-Effect Sensing;" Allegro Microsystems, Inc. Product Description; May 10, 2008; 7 sheets.
Häberli et al.; "Contactless Angle Measurements by CMOS Magnetic Sensor with On Chip Read-Out Circuit;" The 8$^{th}$ International Conference on Solid-State Sensors and Actuators and Eurosensors IX; Jan. 25-29, 1995; pp. 134-137; 4 pages.
Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907; 6 pages.
Hiligsmann et al.; "Monolithic 360 Degrees Rotary Position Sensor Ic;" 2004 IEEE Proceedings of Sensors, vol. 3; Oct. 24-27, 2004; pp. 1137-1142; 6 pages.
Kejik et al.; "Circular Hall Transducer for Angular Position Sensing;" International Solid-State Sensors, Actuators and Microsystems Conference; Transducers; Jun. 2007; pp. 2593-2596; 4 pages.
Lou Law; "Angle Position Sensing with 2-Axis Hall ICs;" Sensors Magazine, vol. 20, No. 3; Mar. 2003; 7 sheets
Masson et al.; "Multiturn and high precision through-shaft magnetic sensors;" Sensor + Text Conference; Proceedings II; May 2009; pp. 41-46; 6 pages.
Metz et al.; "Contactless Angle Measurement Using Four Hall Devices on Single Chip;"; International Conference on Solid State Sensors and Actuators; Transducer; vol. 1; Jun. 16-19, 1997; pp. 385-388; 4 pages.
Munter; "A Low-offset Spinning-current Hall Plate;" Sensors and Actuators, vol. A21-A23; Jan. 1990; pp. 743-746; 4 pages.
Novotechnik Siedie Group; "How New Angular Positioning Sensor Technology Opens a Broad Range of New Applications;" Vert-X Technology; Dec. 2001; pp. 1-5.
Paranjape et al.; "A CMOS-compatible 2-D vertical Hall magnetic-field sensor using active carrier confinement and post-process micromachining;" The 8$^{th}$ International Conference on Solid-State Sensors and Actuators, Physical vol. 53, Issues 1-3; May 1996; pp. 278-283; 6 pages.
Petoussis et al.; "A Novel Hall Effect Sensor Using Elaborate Offset Cancellation Method;" Transducers Journal, vol. 100, Issue 1; Jan. 2009; pp. 85-91; 7 pages.
Popovic; "Not-plate-like Hall magnetic sensors and their applications;" Sensors and Actuators A: Physical, vol. 85, Issues 1-3; Aug. 2000; pp. 9-17; 9 pages.
Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58; 4 pages.
Roumenin; "Magnetic sensors continue to advance towards perfection;" Sensors and Actuators A: Physical, vol. 46-47, Issues 1-3; Jan.-Feb. 1995; pp. 273-279; 7 pages.
Schneider et al.; "Temperature Calibration of CMOS Magnetic Vector Probe for Contactless Angle Measurement System;" International Electron Devices Meeting; Dec. 8-11, 1996; pp. 533-536; 4 pages.
Sensima technology sa; "CVRD: a new concept of Angular Position Sensor;" Slide Presentation for Allegro Microsystems; Mar. 2009; 17 sheets.
Sentron; AN-101; "Angular position sensing with 2-Axis Hall IC 2SA-10;" Feb. 12, 2004; http://www.diegm.uniud.it/petrella/Azionamenti%20Elettrici%20II/Sensori%20e%20trasduttori/Data%20Sheet%20-%202SA-10.pdf; pp. 1-7.
Van der Meer; et al; "CMOS quad spinning-current Hall-sensor system for compass application;" IEEE Proceedings of Sensors, vol. 3; Oct. 24-27, 2004; pp. 1434-1437; 4 pages.
Vogeigesang et al.; Robert Bosch GmbH; "GMR sensors in automotive application;" CS-SNS/ECS Slides Presentation; Mar. 2, 2005; 16 sheets.
Volder; "The CORDIC Trigonometric Computing Technique;" The Institute of Radio Engineers, Inc.; IRE Transactions on Electronic Computers, vol. EC, Issue 3; Sep. 1959; pp. 226-230; 5 pages.

\* cited by examiner

CIRCULAR VERTICAL HALL (CVH) SENSING ELEMENT WITH DC OFFSET REMOVAL

FIELD OF THE INVENTION

This invention relates generally to electronic circuits, and, more particularly, to an electronic circuit that can process signals from a circular vertical Hall (CVH) sensing element to remove a DC offset.

BACKGROUND OF THE INVENTION

Sensing elements are used in a variety of applications to sense characteristics of an environment. Sensing elements include, but are not limited to, pressure sensing elements, temperature sensing elements, light sensing elements, acoustic sensing elements, and magnetic field sensing elements.

A magnetic field sensor can include one or more magnetic field sensing elements and also other electronics.

Magnetic field sensors can be used in a variety of applications. In one application, a magnetic field sensor can be used to detect a direction of a magnetic field. In another application, a magnetic field sensor can be used to sense an electrical current. One type of current sensor uses a Hall effect magnetic field sensing element in proximity to a current-carrying conductor.

Planar Hall elements and vertical Hall elements are known types of magnetic field sensing elements that can be used in magnetic field sensors. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

Circular Vertical Hall (CVH) elements may employ multiple vertical Hall effect elements arranged in a circle and sampled sequentially. In some instances, the output signal of a CVH element may have a DC offset. If the DC offset is large, it may cause errors or inaccuracies in subsequent processing of the output signal. For example, a large DC offset may result in clipping of the signal during amplification or other processing and signal shaping.

SUMMARY OF THE INVENTION

In an embodiment, a magnetic field sensor includes a semiconductor substrate, a circular vertical Hall (CVH) sensing element comprising a plurality of vertical Hall elements arranged over an implant region in a semiconductor substrate, where adjacent ones of the plurality of vertical Hall element at predetermined angles from each other. The magnetic field sensor also includes a CVH output stage comprising one or more of drive circuits to drive the plurality of vertical Hall elements and produce an analog signal representing a strength of an external magnetic field as detected by the plurality of vertical Hall elements, and a filter coupled to the CVH output stage to receive the analog signal, the filter configured to remove a DC component from the analog signal to produce a filtered signal. An analog-to-digital converter may be coupled to receive the filtered signal and produce a digital signal. A processor stage may be coupled to receive the filtered signal and operable to compute an estimated angle of the external magnetic field.

One or more of the following features may be included. The analog-to-digital converter may be a sigma-delta analog-to-digital converter and the digital signal is a pulse stream. The CVH sensing element may include a switching network having a plurality of connection nodes, wherein a portion of the plurality of connections are coupled to the one or more drive circuits to drive the vertical Hall elements coupled to the connection nodes. The filter may be a high pass filter or a band pass filter.

The filter may comprise a Gilbert cell, which may be an AC-coupled Gilbert cell. The Gilbert cell comprises a first transistor pair, a second transistor pair, and a capacitive coupling between the first and second transistor pairs. The Gilbert cell may further comprise a third transistor pair coupled between the capacitive coupling and the second transistor pair, the third transistor pair coupled in a source-follower configuration. The Gilbert cell may further comprise a fourth transistor pair coupled to the capacitive coupling, wherein conduction through the fourth transistor pair is controlled by a bias voltage.

In another embodiment, a method of sensing an angle of a magnetic field includes: activating one or more vertical Hall element arranged over an implant region in a semiconductor substrate, adjacent ones of the plurality of contacts at predetermined angles from each other, the selectively activating in order to activate the one or more of the plurality of vertical Hall elements; providing an analog signal from the one or more activated vertical Hall elements, the signal representing a magnitude of an external magnetic field as detected by the one or more vertical hall elements; filtering a DC component from the analog signal to produce a filtered signal; and converting the filtered signal to a digital signal.

One or more of the following features may be included. Converting the filtered signal may include providing the filtered signal to a sigma-delta analog-to-digital converter which produces a pulsed stream as an output signal. Selectively activating the one or more Hall elements may include activating a drive circuit and a switching network having a plurality of connection nodes, wherein a portion of the plurality of connections are coupled to the drive circuit to drive the vertical Hall elements coupled to the connection nodes. Filtering the signal may include filtering the analog signal through a high pass filter and/or filtering the analog signal through a band pass filter.

A Gilbert cell may be used to filter the analog signal. The Gilbert cell may be an AC-coupled Gilbert cell. The Gilbert cell may comprise a first transistor pair, a second transistor pair, and a capacitive coupling between the first and second transistor pairs. The Gilbert cell may further comprise a third transistor pair coupled between the capacitive coupling and the second transistor pair, the third transistor pair coupled in a source-follower configuration. The Gilbert cell may further comprise a fourth transistor pair coupled to the capacitive coupling, wherein conduction through the fourth transistor pair is controlled by a bias voltage.

In another embodiment, a circuit comprises a Gilbert cell having a first transistor pair, a second transistor pair, and a capacitive coupling between the first and second transistor pairs.

One or more of the following features may be included. The circuit may include a third transistor pair coupled between the capacitive coupling and the second transistor pair, the third transistor pair coupled in a source-follower configuration. The circuit may include a fourth transistor pair coupled to the capacitive coupling, wherein conduction through the fourth transistor pair is controlled by a bias voltage. The first and second transistor pairs may comprise bipolar junction transistors and the third and fourth transistor pairs may comprise field effect transistors. The capacitive coupling may include a capacitor pair, each capacitor coupled between a base terminal of a transistor of the first transistor pair and a base terminal of a transistor of the second transistor pair.

BRIEF DESCRIPTION OF THE DRAWINGS

The foregoing features of the invention, as well as the invention itself may be more fully understood from the following detailed description of the drawings, in which.

The figures in this disclosure are provided as examples and used to explain and illustrate the technology. One skilled in the art will recognize that the scope of the disclosure is not limited by the embodiments shown in the figures, and my include additional embodiments, equivalents, etc.

DETAILED DESCRIPTION OF THE INVENTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, a magnetic tunnel junction (MTJ), a spin-valve, etc. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR, spin-valve) and vertical Hall elements tend to have axes of sensitivity parallel to a substrate.

It will be appreciated by those of ordinary skill in the art that while a substrate (e.g. a semiconductor substrate) is described as "supporting" the magnetic field sensing element, the element may be disposed "over" or "on" the active semiconductor surface, or may be formed "in" or "as part of" the semiconductor substrate, depending upon the type of magnetic field sensing element. For simplicity of explanation, while the embodiments described herein may utilize any suitable type of magnetic field sensing elements, such elements will be described here as being supported by the substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "target" is used to describe an object to be sensed or detected by a magnetic field sensor or magnetic field sensing element. A target may be ferromagnetic or magnetic.

As is known in the art, magnetic fields have direction and strength. The strength of a magnetic field can be described as a magnitude of a magnetic flux or flux density. Therefore, the terms magnetic field "strength" and magnetic "flux" may be used interchangeably in this document.

As used herein, the term "ground" refers to a reference potential in an electrical circuit from which other voltages are measured, or a common return path for electrical current. Ground may also refer to a portion of a circuit that is connected to earth ground.

Figure 1:
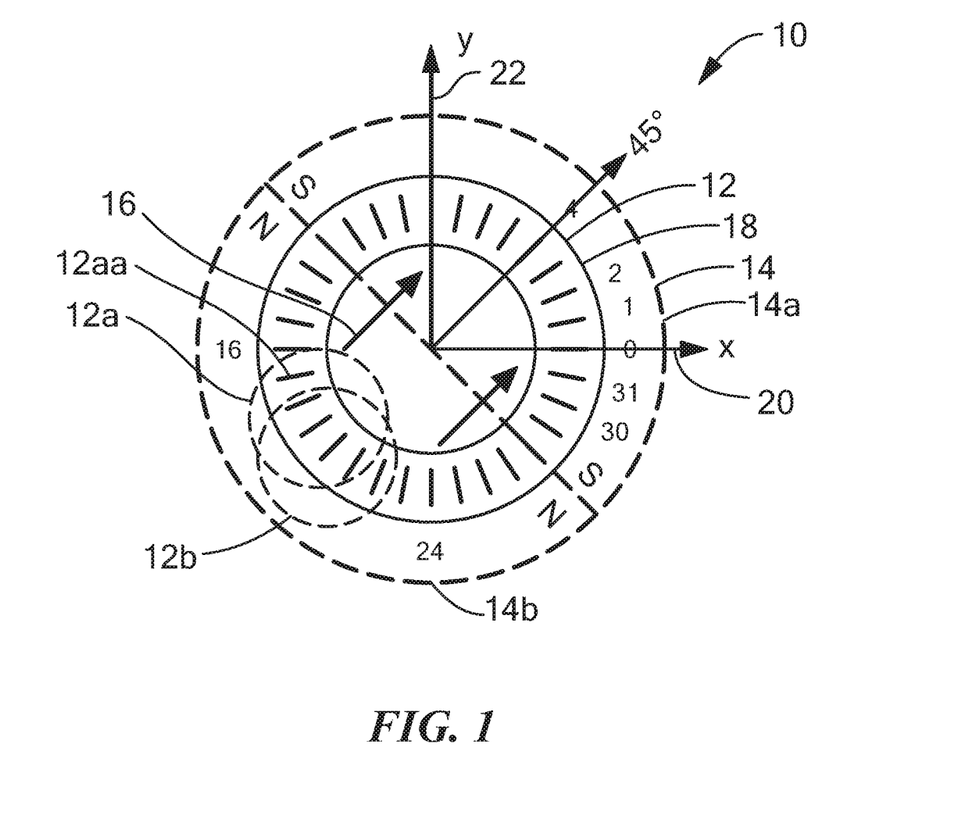
FIG. 1 is a pictorial showing a circular vertical Hall (CVH) sensing element having a plurality of vertical Hall elements arranged in a circle over an implant region and a two pole magnet disposed close to the CVH sensing element.

Referring to FIG. 1, a circular vertical Hall (CVH) sensing element 12 includes a common circular implant region 18. In embodiments, implant region 18 may be a common or single implant region, or one or more implant regions separated by other implants. A plurality of vertical Hall elements may be disposed on implant region 18, of which a vertical Hall element 12a is an example. Each vertical Hall element has a plurality of Hall element contacts (e.g., four or five contacts), of which a vertical Hall element contact 12aa is an example.

The term "common" circular implant region indicates that the plurality of vertical Hall elements of the CVH sensing element can have no diffused barriers between the plurality of vertical Hall elements. However, there can be a diffused barrier region outside of (i.e., radially beyond) the common circular implant region 18.

A particular vertical Hall element (e.g., 12a) within the CVH sensing element 12, which, for example, can have five adjacent contacts, can share some, for example, four, of the five contacts with a next vertical Hall element (e.g., 12b). Thus, a next vertical Hall element can be shifted by one contact from a prior vertical Hall element. For such shifts by one contact, it will be understood that the number of vertical Hall elements is equal to the number of vertical Hall element contacts, e.g., 32. However, it will also be understood that a next vertical Hall element can be shifted by more than one contact from the prior vertical Hall element, in which case, there are fewer vertical Hall elements than there are vertical Hall element contacts in the CVH sensing element.

A center of a vertical Hall element 0 is positioned along an x-axis 20 and a center of vertical Hall element 8 is positioned along a y-axis 22. In the example shown in FIG. 1, there are thirty-two vertical Hall elements and thirty-two vertical Hall element contacts. However, a CVH sensing element can have more than or fewer than thirty-two vertical Hall elements and more than or fewer than thirty-two vertical Hall element contacts.

In some applications, a circular magnet 14 having a south side 14a and a north side 14b can be disposed over the CVH sensing element 12. The circular magnet 14 may generate a magnetic field 16 having a direction from the north side 14b to the south side 14a, here shown to be pointed to a direction of about forty-five degrees relative to x-axis 20. Other magnets having other shapes and configurations are possible.

In some applications, the circular magnet 14 is mechanically coupled to a rotating object (a target object), for example, an automobile crankshaft or an automobile camshaft, and is subject to rotation relative to the CVH sensing element 12. With this arrangement, the CVH sensing element 12 in combination with an electronic circuit described below can generate a signal related to the angle of rotation of the magnet 14.

Figure 2:
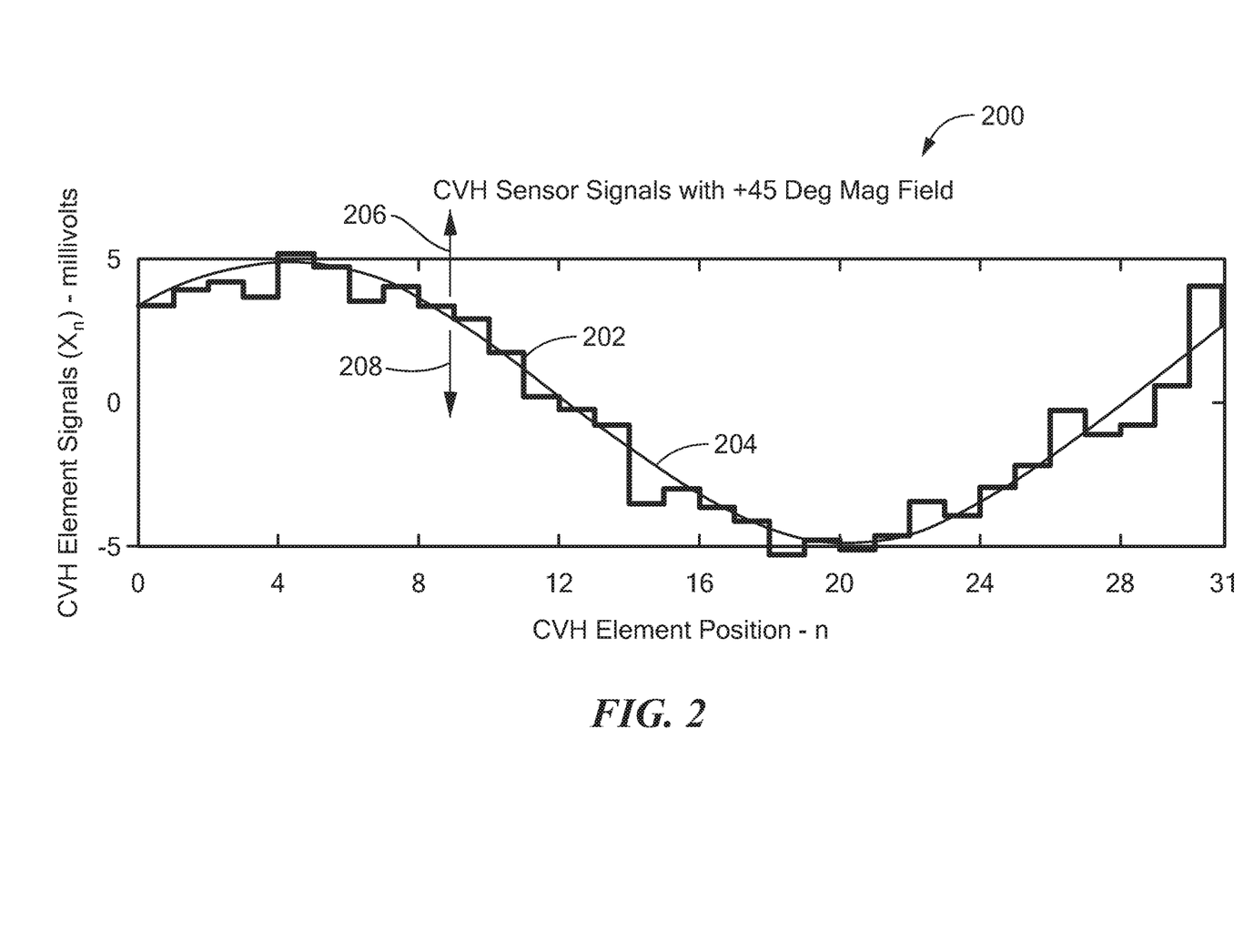
FIG. 2 is a graph showing an output signal as may be generated by the CVH sensing element of FIG. 1.

Referring now to FIG. 2, a graph 200 has a horizontal axis with a scale in units of CVH vertical Hall element position, n, around a CVH sensing element, for example, the CVH sensing element 12 of FIG. 1. The graph 200 also has a vertical axis with a scale in units of amplitude in units of millivolts. The vertical axis is representative of output signal levels from the plurality of vertical Hall elements of the CVH sensing element.

The graph 200 includes a signal 202 representative of output signal levels from the plurality of vertical Hall elements of the CVH taken sequentially with the magnetic field 16 of FIG. 1 stationary and pointing in a direction of forty-five degrees.

The graph 200 shows one CVH sensing element cycle, i.e. one revolution of the CVH sensing element where each Hall element is activated in sequence around the circumference of the CVH sensing element. For example, the portion of signal 202 shown in graph 200 is produced during one CVH cycle as each of the Hall elements are activated around the circumference of the CVH sensing element. In this example, the CVH cycle starts with Hall element position 0, and ends with Hall element position 31. Of course, in this example, a CVH cycle can have any start and end point as long as the CVH cycle includes one revolution of the CVH sensing element.

Referring briefly to FIG. 1, as described above, vertical Hall element 0 is centered along the x-axis 20 and vertical Hall element 8 is centered along the y-axis 22. In the exemplary CVH sensing element 12, there are thirty-two vertical Hall element contacts and a corresponding thirty-two vertical Hall elements, each vertical Hall element having a plurality of vertical Hall element contacts, for example, five contacts.

In FIG. 2, a maximum positive signal is achieved from a vertical Hall element centered at position 4, which is aligned with the magnetic field 16 of FIG. 1, such that a line drawn between the vertical Hall element contacts (e.g., five contacts) of the vertical Hall element at position 4 is perpendicular to the magnetic field 16. A maximum negative signal is achieved from a vertical Hall element centered at position 20, which is also aligned with the magnetic field 16 of FIG. 1, such that a line drawn between the vertical Hall element contacts (e.g., five contacts) of the vertical Hall element at position 20 is also perpendicular to the magnetic field 16.

A sine wave 204 is provided to more clearly show the ideal behavior of the signal 202. The signal 202 has variations due to vertical Hall element offsets, which tend to somewhat randomly cause element output signals to be too high or too low relative to the sine wave 204, in accordance with offset errors for each element. In embodiments, the offset signal errors may be undesirable. In some embodiments, the offset errors can be reduced by "chopping" each vertical Hall element. Chopping will be understood to be a process by which vertical Hall element contacts of each vertical Hall element are driven in different configurations and signals are received from different ones of the vertical Hall element contacts of each vertical Hall element to generate a plurality of output signals from each vertical Hall element. The plurality of signals can be arithmetically processed (e.g., summed or otherwise averaged) resulting in a signal with less offset. Chopping is described more fully in U.S. Pat. No. 8,890,518 (filed Jun. 8, 2011), which is incorporated here by reference in its entirety.

In FIG. 2, signal 202 (and sine wave 204) are centered around zero volts. In other words, as shown, signal 202 does not include a DC offset. In practice, signal 202 may include a DC offset. Thus, signal 202 may be shifted up, in the direction of arrow 206 in the case of a positive DC voltage offset, or down, in the direction of arrow 208, in the case of a negative DC voltage offset.

Figure 3:
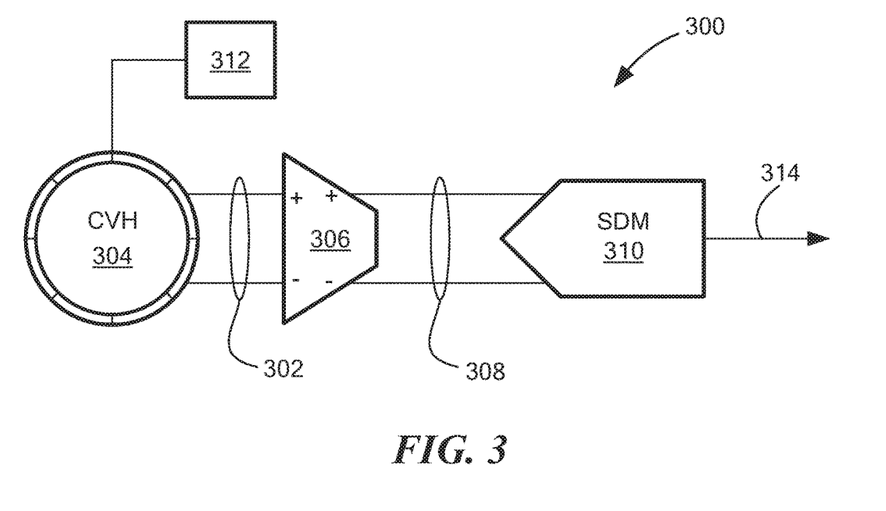
FIG. 3 is a block diagram of a magnetic field sensor having a CVH sensing element.

In embodiments, signal 202 may be a differential signal, such as differential signal 302 in FIG. 3. In other embodiments, signal 202 may be a single-ended signal.

If signal 202 contains a DC offset, subsequent processing circuits that receive signal 202 may introduce errors in the signal. For example, if an amplifier receives signal 202, and signal 202 contains a DC offset that is too high for the amplifier, the amplified output signal of the amplifier may exceed the amplifier's dynamic range. This may result in clipping or other artifacts introduced in the signal, which may cause inaccuracies in detecting the magnetic target. Although an amplifier is used as an example, one skilled in the art will recognize that other processing circuits may also introduce errors if signal 202 includes a DC offset that exceeds the input range of the processing circuit.

An example of full operation of the CVH sensing element 12 of FIG. 1 and generation of the signal 202 of FIG. 2 are described in more detail in the above-described PCT Patent Application No. PCT/EP2008/056517, entitled "Magnetic Field Sensor for Measuring Direction of a Magnetic Field in a Plane," filed May 28, 2008, which is published as PCT Publication No. WO 2008/145662, and is incorporated here by reference.

As will be understood from PCT Patent Application No. PCT/EP2008/056517, groups of contacts of each vertical Hall element can be used in a multiplexed or chopped arrangement to generate chopped output signals from each vertical Hall element. Thereafter, a new group of adjacent vertical Hall element contacts can be selected (i.e., a new vertical Hall element), which can be offset by one or more elements from the prior group. The new group can be used in the multiplexed or chopped arrangement to generate another chopped output signal from the next group, and so on.

Each step of the signal 202 can be representative of a chopped output signal from one respective group of vertical Hall element contacts, i.e., from one respective vertical Hall element. However, in other embodiments, no chopping is performed and each step of the signal 202 is representative of an unchopped output signal from one respective group of vertical Hall element contacts, i.e., from one respective vertical Hall element. Thus, the graph 502 is representative of a CVH output signal with or without the above-described grouping and chopping of vertical Hall elements.

It will be understood that, using techniques described above in PCT Patent Application No. PCT/EP2008/056517, a phase of the signal 502 (e.g., a phase of the signal 204) can be found and can be used to identify the pointing direction of the magnetic field 16 of FIG. 1 relative to the CVH sensing element 12.

Referring now to FIG. 3, an embodiment of a magnetic field sensor 300 includes a CVH element 304, which may be the same as or similar to CVH element 10. CVH element 304 may be coupled to DC offset module 306, which may receive output signal 302 from CVH element 304. Output signal 302 may be the same as or similar to signal 202 and may contain a DC offset, as described above.

Magnetic field sensor 300 may include one or more of drive circuits 312 to drive the plurality of vertical Hall elements within CVH 304 to produce an analog signal 302 representing a strength of an external magnetic field as detected by the plurality of vertical Hall elements.

A magnet (not shown) can be disposed proximate to the CVH sensing element 304, and can be coupled to a target object (not shown). The magnet may be the same as or similar to magnet 14 of FIG. 1.

Magnetic field sensor 300 may be configured to detect the position, rotational angle, speed, direction, and/or other states of a rotating magnetic target by, for example, measuring and processing the phase and changes in phase of converted signal 314.

As described above, the CVH sensing element 304 can have a plurality of vertical Hall elements, each vertical Hall element comprising a group of vertical Hall element contacts (e.g., five vertical Hall element contacts), of which the vertical Hall element contact is but one example.

In some embodiments, a sequencer circuit (not shown), which may be situated between CVH 304 and amplifier 306, can control CVH sensing element 304 by sequentially switching individual vertical Hall elements on and off via the drive circuit 312. The sequencer circuit may sequentially couple vertical Hall element output contacts to provide sequential CVH differential output signal 302. As noted above, in certain embodiments, output signal 302 is a differential signal. In other embodiments, output signal 316 may be a non-differential signal.

The CVH output signal 302 may be comprised of sequential output signals taken one-at-a-time around the CVH sensing element 304, where each output signal is generated on a separate signal path and switched by the sequencer circuit 312 into the path of output signal 316. The CVH output signal 316 can be represented as a switched set of CVH output signals $x_n = x_0$ to $x_{N-1}$, taken one at a time, where n is equal to a vertical Hall element position (i.e., a position of a group of vertical Hall element contacts that form a vertical Hall element) in the CVH sensing element 304, and where there are N such positions.

DC offset module 306 may remove the DC offset of signal 302. As is known in the art, a DC component of a signal is a zero-frequency component. In some instances, the DC component may be a very-low frequency component with respect to the frequency of signal 302, which may cause signal the voltage level of signal 302 to "drift" up and down. If the low-frequency component is low enough, it may effectively act as a DC offset component of signal 302. Thus, in embodiments, DC offset module 306 may be a high-pass filter that removes zero-frequency and/or low-frequency components from signal 302. In embodiments, the cutoff frequency of the high-pass filter may be chosen to remove unwanted zero and low-frequency drift components of signal 302, while retaining the relatively higher frequency component of signal 302 that carries information about the sensed magnetic target. In other embodiments, DC offset module 306 may comprise a band pass filter.

In embodiments, DC offset module 306 may comprise a Gilbert cell. A Gilbert cell may, for example, may convert voltage signal 302 into a current signal 308. If DC offset module 306 is a Gilbert cell, it may be an AC-coupled Gilbert cell configured to act as a high-pass filter and remove low- and/or zero-frequency components from signal 302. In other embodiments, signal 308 may be a voltage signal and DC offset module 306 may be a high-pass filter that produces a voltage output.

Magnetic field sensor 300 may also include analog-to-digital converter (ADC) 310 coupled to receive signal 308 and produce converted signal 314. In embodiments, ADC 310 is a sigma-delta converter and converted signal 314 is a sigma-delta-modulated waveform (e.g. a bit-stream) representing the output of CVH sensing element 304. For example, recalling that signal 202 in FIG. 2 represents the output of CVH sensing element 10 under certain circumstances, converted signal 314 could be a sigma-delta-modulated version of signal 202 and may also represent the output of a CVH sensing element such as CVH sensing element 304.

Figure 4:
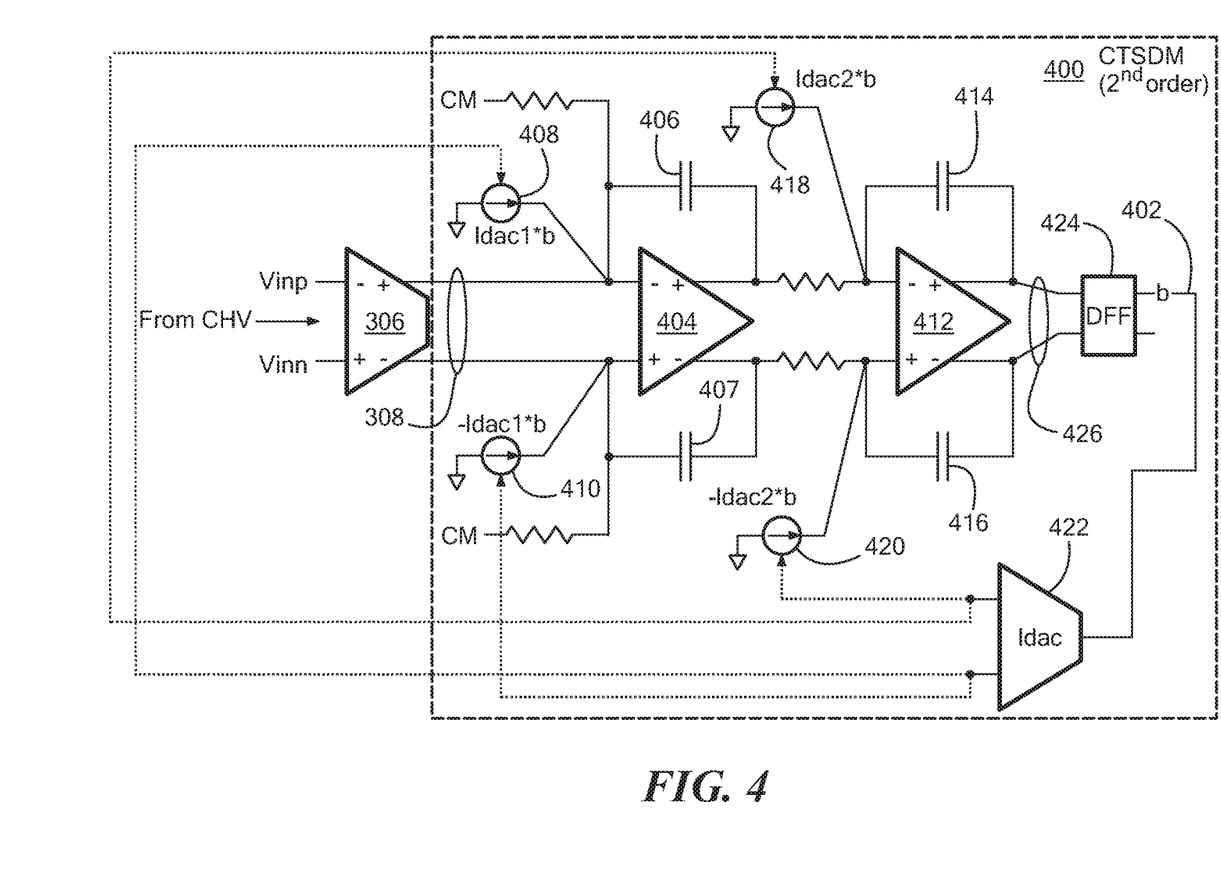
FIG. 4 is a circuit diagram of a continuous-time sigma delta module that may be used in a magnetic field sensor.

Referring to FIG. 4, ADC 400 may be the same as or similar to ADC 310 of FIG. 3. As shown in FIG. 4, ADC 400 may be a sigma-delta modulator that can convert current signal 308 into a digital bit stream 402. (Signal 402 may be the same as or similar to signal 314).

ADC 400 may be a second order sigma-delta modulator having two stages. The first stage may include operational amplifier (op-amp) 404, capacitors 406 and 407, and current sources 408 and 410. The second stage may include op-amp 412, capacitors 414 and 416, and current sources 418 and 420. ADC 400 may also include feedback loop having a digital-to-analog converter (DAC) 422. DAC 422 may convert digital bit-stream 402 into an analog signal that can be used to control current sources 408, 410, 418, and 420.

A bit-stream converter 424 may receive output signal 426 from op-amp 412 and convert it to digital bit-stream 402. Bit-stream converter 424 may be a flip-flop or other circuit that can produce a digital output stream from signal 426.

In an embodiment, each stage of ADC 400 may act as an integrator circuit, which takes a current signal an input and produces a digital output signal. Thus, in such embodiments, it may be beneficial if DC offset module 306 produces a current signal as its output (e.g. as signal 308) so that minimal or no additional circuit is needed to convert signal 308 to a form that ADC 400 can receive.

Sigma-delta ADC 400 may provide a low-pass filter function. Therefore, in combination with high pass functions described below in conjunction with FIGS. 6 and 7, the overall transfer function can be that of a bandpass filter.

Figure 5:
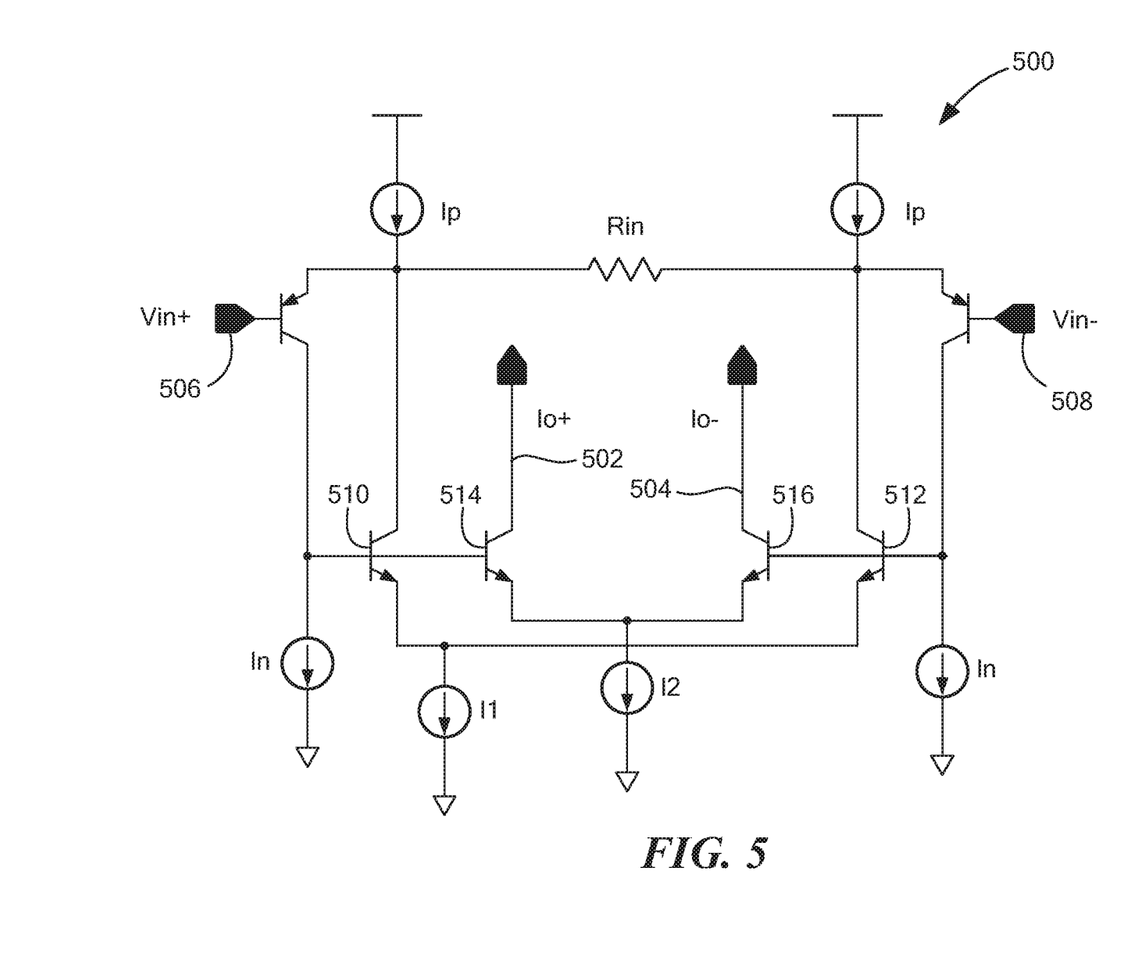
FIG. 5 is a circuit diagram of a Gilbert cell.

Referring to FIG. 5, a Gilbert cell circuit 500 may be the same as or similar to the DC offset module 306 of FIG. 3. Gilbert cell circuit 500 may be a translinear multiplier circuit configured to produce a differential current output signal (comprising signal 502 and 504) representing a product of a differential input signal (comprising signal 506 and 508). Because the output signals 502 and 504 are a differential current signal, they may be coupled directly to ADC 400's inputs. If implemented on a semiconductor chip, this may reduce the amount of space needed by eliminating the need for additional circuits to convert the signals to other forms.

Gilbert cell 500 may include a first transistor pair 510 and 512, and a second transistor pair 514 and 516. The first transistor pair 510 and 512 may comprise a first or outside stage of the Gilbert cell and the second transistor pair 514 and 516 may comprise a second or inside stage of the Gilbert cell. In embodiments, the first transistor pair 510 and 512 and the second transistor pair 514 and 516 may be considered stages of the Gilbert cell. For example, first transistor pair 510 and 512 may be considered an outside stage of the Gilbert cell and second transistor pair 514 and 516 may be considered an inside stage of the Gilbert cell.

In an embodiment, signal 302 in FIG. 3 may be the same as differential signal pair 506 and 508. In other words, Gilbert cell 500 may be coupled to receive differential signal 302 as input signals 506 and 508 from CVH element 304. Likewise, differential output signal 308 may be the same as differential current output signals 502 and 504. In other words, Gilbert cell 500 may be coupled to provide differential current output signals 502 and 504 as inputs to ADC 310.

Figure 6:
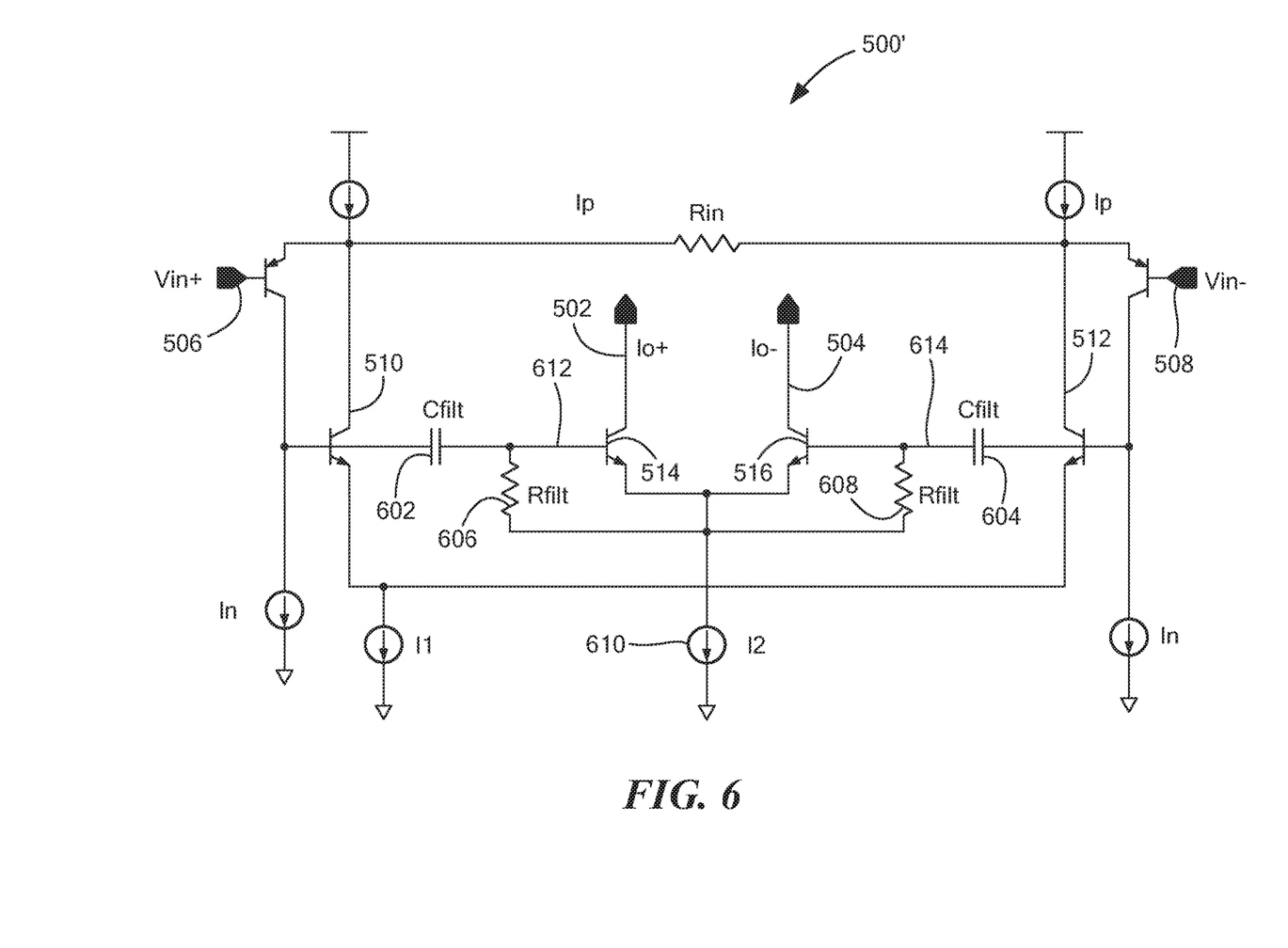
FIG. 6 is a circuit diagram of an AC-coupled Gilbert cell.

Referring to FIG. 6, Gilbert cell 500' may be the same as or similar to DC offset module 306 of FIG. 3. As shown, capacitor 602 may be coupled in series between the base of transistor 510 (one of the outer pair) and the base of transistor 514 (one of the inner pair), and capacitor 604 may be coupled in series between the base of transistor 512 (one of the outer pair) and transistor 516 (one of the inner pair). Resistor 606 may be coupled between the base of transistor 514 and current sink 610, and resistor 608 may be coupled between the base of transistor 516 and current sink 610.

In an embodiment, capacitor 602 and resistor 606 may be configured to act as an RC high pass filter that removes low- and zero-frequency components from the signal at the base of transistor 514. Similarly, capacitor 604 and resistor 605 may be configured to act as an RC high pass filter that removes low- and zero-frequency components from the signal at the base of transistor 516. Thus, the low- and zero-frequency components are removed from the signal (e.g. signal 612 and 614) received by the second or inner stage of the Gilbert cell. As a result, if a DC component is present in the signal (e.g. signals 612 and 614), the DC component may be removed from the signal before it reaches the inner stage. The differential output signal (signals 502 and 504) produced by the inner stage may have no DC offset.

The values of capacitors 602 and 604, and resistors 606 and 608, may be chosen to filter out zero- and low-frequency components of the signal, while allowing higher frequencies that carrying information about the detected magnetic target to pass through the circuit.

Figure 7:
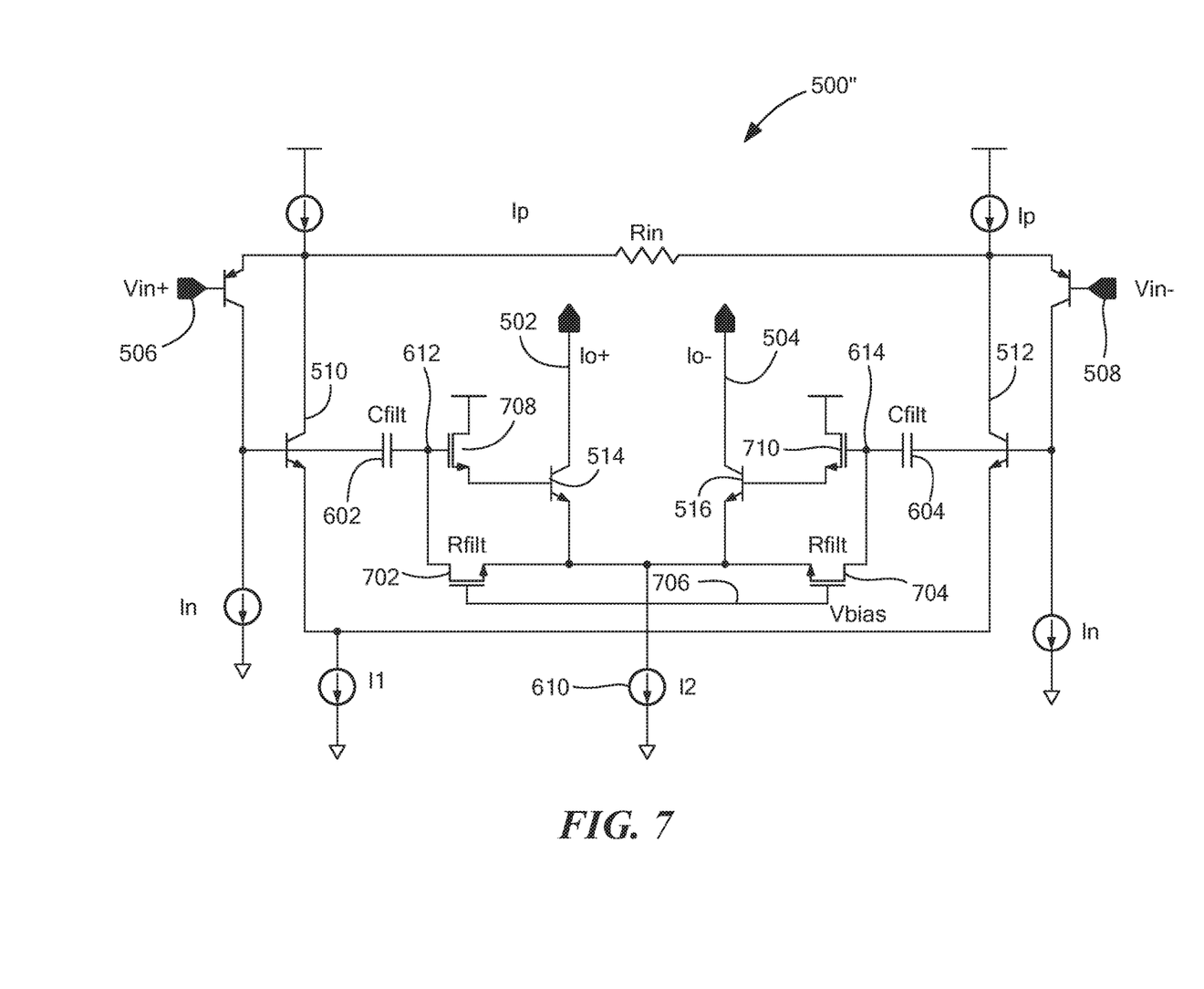
FIG. 7 is a circuit diagram of another embodiment of an AC-coupled Gilbert cell.

Referring to FIG. 7, circuit 500" is another embodiment of an AC-coupled Gilbert cell, similar to Gilbert cell 500' but with certain differences described below. In circuit 500" resistors 606 and 608 may be replaced with transistors 702 and 704, respectively. Transistors 702 and 704 may be coupled in a source-follower configuration, and the gates of transistors 702 and 704 may be driven by a DC bias voltage signal 706. In an embodiment, the value of DC bias voltage signal 706 may keep transistors 702 and 704 in a linear state of operation so they may approximate resistors.

Capacitor 602 and transistor 702 may act as an RC high pass filter to remove zero- and low-frequency components from signal 612, and capacitor 604 and transistor 704 may act as an RC high pass filter to remove zero- and low-frequency components from signal 614. As a result, if a DC component is present in the differential input signal (e.g. signals 506 and 508), the DC component may be removed from the signal before it reaches the inner stage. The differential output signal (signals 502 and 504) produced by the inner stage may have no DC offset.

DC bias voltage signal 706 may be adjustable to modify the effective resistance of transistors 702 and 704, and thus modify the transfer function of the high-pass filter. The value of DC bias voltage signal 706 may be chosen to filter out zero- and low-frequency components of the signal, while allowing higher frequencies that carrying information about the detected magnetic target to pass through the circuit.

Gilbert cell 500" may also include transistors 708 and 710. The gate terminals of transistors 708 and 710 may be coupled to receive filtered signals 612 and 614, respectively, and the source terminals of transistors 708 and 710 may be coupled to the base terminals of transistors 514 and 516, respectively. Transistors 708 and 710 may be configured to drive the base terminals transistors 514 and 516, to subsequently produce output current signals 502 and 504.

As shown in the figures, transistors 510, 512, 514, and 516 may be bipolar junction transistors (BJTs), and transistors 702, 704, 708, and 710 may be field-effect transistors (FETs).

Transistors 702 and 704 may provide higher effective resistances resistors 606 and 608 of FIG. 6, particularly when fabricated on a semiconductor substrate. Thus, the Gilbert Cell 500" may provide a lower corner frequency high pass filter than the Gilbert Cell 500'

All references cited in this document are incorporated by reference in their entirety. Having described various embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that scope of the patent should not be limited to the described embodiments but rather should be limited only by the spirit and scope of the following claims.

The invention claimed is:
1. A magnetic field sensor, comprising:
   a semiconductor substrate;
   a circular vertical Hall (CVH) sensing element comprising a plurality of vertical Hall elements arranged over an implant region in the semiconductor substrate, adjacent ones of the plurality of vertical Hall element at predetermined angles from each other;
   a CVH output stage comprising one or more of drive circuits to drive the plurality of vertical Hall elements and produce an analog signal representing a strength of an external magnetic field as detected by the plurality of vertical Hall elements;
   a high pass filter coupled to the CVH output stage to receive the analog signal, the high pass filter configured to remove a DC component from the analog signal to produce a filtered signal; and
   an analog-to-digital converter coupled to receive the filtered signal and produce a digital signal;
   wherein the high pass filter comprises a single Gilbert cell.

2. The magnetic field sensor of claim 1, wherein the analog-to-digital converter is a sigma-delta analog-to-digital converter and the digital signal is a pulse stream.

3. The magnetic field sensor of claim 1, wherein the CVH sensing element further comprises a switching network having a plurality of connection nodes, wherein a portion of the plurality of connections are coupled to the one or more drive circuits to drive the vertical Hall elements coupled to the connection nodes.

4. A magnetic field sensor, comprising:
a semiconductor substrate;
a circular vertical Hall (CVH) sensing element comprising a plurality of vertical Hall elements arranged over an implant region in the semiconductor substrate, adjacent ones of the plurality of vertical Hall element at predetermined angles from each other;
a CVH output stage comprising one or more of drive circuits to drive the plurality of vertical Hall elements and produce an analog signal representing a strength of an external magnetic field as detected by the plurality of vertical Hall elements;
a filter coupled to the CVH output stage to receive the analog signal, the filter configured to remove a DC component from the analog signal to produce a filtered signal, wherein the filter comprises a Gilbert cell, wherein the Gilbert cell is an AC-coupled Gilbert cell, the Gilbert cell comprising:
a first transistor pair;
a second transistor pair;
a capacitive coupling between the first and second transistor pairs; and
a third transistor pair coupled between the capacitive coupling and the second transistor pair, the third transistor pair coupled in a source-follower configuration; and
an analog-to-digital converter coupled to receive the filtered signal and produce a digital signal.

5. The magnetic field sensor of claim 4, wherein the filter is a band pass filter.

6. The magnetic field sensor of claim 4, wherein the Gilbert cell is an AC-coupled Gilbert cell.

7. The magnetic field sensor of claim 6 wherein the Gilbert cell comprises a first transistor pair, a second transistor pair, and a capacitive coupling between the first and second transistor pairs.

8. The magnetic field sensor of claim 4, wherein the filter is a high pass filter.

9. The magnetic field sensor of claim 4 further comprising a fourth transistor pair coupled to the capacitive coupling, wherein conduction through the fourth transistor pair is controlled by a bias voltage.

10. A method of sensing an angle of a magnetic field comprising:
selectively activating one or more vertical Hall element arranged over an implant region in a semiconductor substrate, adjacent ones of the plurality of contacts at predetermined angles from each other, the selectively activating in order to activate the one or more of the plurality of vertical Hall elements;
providing an analog signal from the one or more activated vertical Hall elements, the signal representing a magnitude of an external magnetic field as detected by the one or more vertical hall elements;
high pass filtering a DC component from the analog signal to produce a filtered signal; and
converting the filtered signal to a digital signal;
wherein filtering comprises filtering the analog signal through a single Gilbert cell.

11. The method of claim 10 wherein converting the filtered signal comprises providing the filtered signal to a sigma-delta analog-to-digital converter which produces a pulsed stream as an output signal.

12. The method of claim 10 wherein selectively activating the one or more Hall elements comprises selectively activating a drive circuit and a switching network having a plurality of connection nodes, wherein a portion of the plurality of connections are coupled to the drive circuit to drive the vertical Hall elements coupled to the connection nodes.

13. A method of sensing an angle of a magnetic field comprising:
selectively activating one or more vertical Hall element arranged over an implant region in a semiconductor substrate, adjacent ones of the plurality of contacts at predetermined angles from each other, the selectively activating in order to activate the one or more of the plurality of vertical Hall elements;
providing an analog signal from the one or more activated vertical Hall elements, the signal representing a magnitude of an external magnetic field as detected by the one or more vertical hall elements;
filtering a DC component from the analog signal to produce a filtered signal; and
converting the filtered signal to a digital signal;
wherein filtering comprises filtering the analog signal through a Gilbert cell, wherein the Gilbert cell is an AC-coupled Gilbert cell, the Gilbert cell comprising:
a first transistor pair;
a second transistor pair, a capacitive coupling between the first and second transistor pairs; and
a third transistor pair coupled between the capacitive coupling and the second transistor pair, the third transistor pair coupled in a source-follower configuration.

14. The method of claim 13 further comprising a fourth transistor pair coupled to the capacitive coupling, wherein conduction through the fourth transistor pair is controlled by a bias voltage.

15. A circuit comprising:
a Gilbert cell having:
a first transistor pair,
a second transistor pair;
a capacitive coupling between the first and second transistor pairs;
a third transistor pair coupled between the capacitive coupling and the second transistor pair, the third transistor pair coupled in a source-follower configuration
a fourth transistor pair coupled to the capacitive coupling, wherein conduction through the fourth transistor pair is controlled by a bias voltage; and
wherein the first and second transistor pairs comprise bipolar junction transistors and the third and fourth transistor pairs comprise field effect transistors,
wherein the Gilbert cell is an AC-coupled Gilbert cell.

* * * * *

UNITED STATES PATENT AND TRADEMARK OFFICE
CERTIFICATE OF CORRECTION

PATENT NO. : 10,495,701 B2  
APPLICATION NO. : 15/447507  
DATED : December 3, 2019  
INVENTOR(S) : Hernán D. Romero Page 1 of 1

It is certified that error appears in the above-identified patent and that said Letters Patent is hereby corrected as shown below:

In the Specification

Column 1, Line 54, delete "element" and replace with --elements are--.

Column 2, Line 22, delete "element" and replace with --elements--.

Column 3, Line 30, delete "my" and replace with --may--.

Column 8, Line 2, delete "signal the" and replace with --the--.

Column 8, Line 54, delete "an input" and replace with --and input--.

Column 9, Line 56, delete "carrying" and replace with --carry--.

Column 10, Line 17, delete "carrying" and replace with --carry--.

Column 10, Line 43, delete "scope" and replace with --the scope--.

Signed and Sealed this  
First Day of September, 2020

Andrei Iancu  
*Director of the United States Patent and Trademark Office*